(12) United States Patent
Matsuno et al.

(10) Patent No.: US 8,674,861 B2
(45) Date of Patent: Mar. 18, 2014

(54) ANALOG-TO-DIGITAL CONVERTER

(71) Applicants: Junya Matsuno, Kawasaki (JP); Tetsuro Itakura, Tokyo (JP)

(72) Inventors: Junya Matsuno, Kawasaki (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2814 days.

(21) Appl. No.: 13/681,913

(22) Filed: Nov. 20, 2012

(65) Prior Publication Data

US 2013/0229294 A1    Sep. 5, 2013

(30) Foreign Application Priority Data

Mar. 5, 2012 (JP) ................. 2012-047882

(51) Int. Cl.
*H03M 1/06* (2006.01)
*H03M 1/10* (2006.01)

(52) U.S. Cl.
CPC .......... *H03M 1/0607* (2013.01); *H03M 1/1023* (2013.01)
USPC .......................................... 341/118; 341/120

(58) Field of Classification Search
USPC ................................................. 341/118–120
See application file for complete search history.

(56) References Cited

U.S. PATENT DOCUMENTS

| | | | | |
|---|---|---|---|---|
| 5,329,281 A | * | 7/1994 | Baumgartner et al. | 341/139 |
| 5,696,508 A | * | 12/1997 | Gross et al. | 341/118 |
| 6,714,886 B2 | * | 3/2004 | Sung et al. | 702/107 |
| 7,126,510 B2 | * | 10/2006 | Alon et al. | 341/120 |
| 7,812,747 B2 | * | 10/2010 | Chen | 341/118 |
| 2004/0189386 A1 | * | 9/2004 | Nishimura | 330/253 |

FOREIGN PATENT DOCUMENTS

JP    2011-193257 A    9/2011

OTHER PUBLICATIONS

Chun-Ying Chen e tal; A Low Power 6-Bit Flash ADC With Reference Voltage and Common-Mode Calibration; IEEE Journal of Solid-State Circuits; vol. 44, No, 4, Apr. 2009; pp. 1041-1046.

* cited by examiner

*Primary Examiner* — Howard Williams
(74) *Attorney, Agent, or Firm* — Holtz, Holtz, Goodman & Chick

(57) ABSTRACT

An embodied ADC includes a sampling unit sampling differential input signal to output differential sampled signal which has first and second sampled signals. The ADC includes a reference signal generator generating first and second reference signals and a preamplifier amplifying the differential sampled signal to output a differential amplification signal having first and second amplified outputs. The preamplifier has a first differential amplifier amplifying the first sampled signal using the first reference signal and a second differential amplifier amplifying the second sampled signal using the second reference signal. The ADC includes a comparator comparing the first and second amplified outputs and a correction controller controlling common-mode voltage levels of the first and second reference signals or common-mode voltage levels of the first and second sampled signals in accordance with the operations of the first and second differential amplifiers.

8 Claims, 14 Drawing Sheets

ANALOG-TO-DIGITAL CONVERTER

CROSS-REFERENCE TO RELATED APPLICATION

This application is based upon and claims the benefit of priority from Japanese Patent Application No. 2012-047882, filed on Mar. 5, 2012; the entire contents of which are incorporated herein by reference.

FIELD

Embodiments described herein relate generally to an analog-to-digital converter.

BACKGROUND

A sampler in an analog-to-digital converter (hereinafter, referred to as AD converter or ADC) generally includes a switch and a capacitor in order to sample and hold input analog signals. The switch is turned on and off at predetermined intervals. The capacitor is charged while the switch is being turned on. In the case where the switch of the sampler is formed of a semiconductor device (switching device), charge injection due to a parasitic capacitance of the device becomes a problem. Specifically, in addition to charges of the capacitor of the sampler, charges of the parasitic capacitance of the switching device also appear in an output. This becomes a cause of variations in output common-mode voltage of the sampler.

As methods of preventing the charge injection due to the parasitic capacitance, a method using a dummy switch and a method using a detector are known. In the method using a dummy switch, the dummy switch is provided parallel to the switch of the sampler to absorb the charges of the parasitic capacitance. In the method using a detector, the variations in output common-mode voltage of the sampler are detected and corrected.

DETAILED DESCRIPTION

To prevent charge injection due to a parasitic capacitance in a conventional AD converter, it is necessary to add a device or a circuit to a sampler. However, due to the parasitic capacitance of the added device or the like, electric power for an input buffer that drives the sampler increases. In other words, the entire power consumption of the AD converter increases.

An AD converter of an embodiment has been made to solve such a problem, and it is an object to provide an AD converter capable of reducing charge injection due to a parasitic capacitance while suppressing power consumption.

An analog-to-digital converter (an AD converter) of an embodiment includes a sampling unit configured to sample differential input signal to output a differential sampled signal. The differential sampled signal has a first sampled signal and a second sampled signal. The AD converter includes a reference signal generator configured to generate a first reference signal and a second reference signal and a preamplifier configured to amplify the differential sampled signal to output a differential amplification signal having a first amplified output and a second amplified output. The preamplifier has a first differential amplifier configured to amplify the first sampled signal by using the first reference signal and a second differential amplifier configured to amplify the second sampled signal by using the second reference signal. The first amplified output is based on an output of the first differential amplifier and the second reference signal and the second amplified output is based on an output of the second differential amplifier and the first reference signal. The AD converter includes a comparator configured to compare the first amplified output and the second amplified output with each other and a correction controller. The correction controller is configured to control operations of the first differential amplifier and the second differential amplifier based on a comparison result of the comparator and control common-mode voltage levels of the first reference signal and the second reference signal or common-mode voltage levels of the first sampled signal and the second sampled signal in accordance with the operations of the first differential amplifier and the second differential amplifier.

First Embodiment

Figure 1:
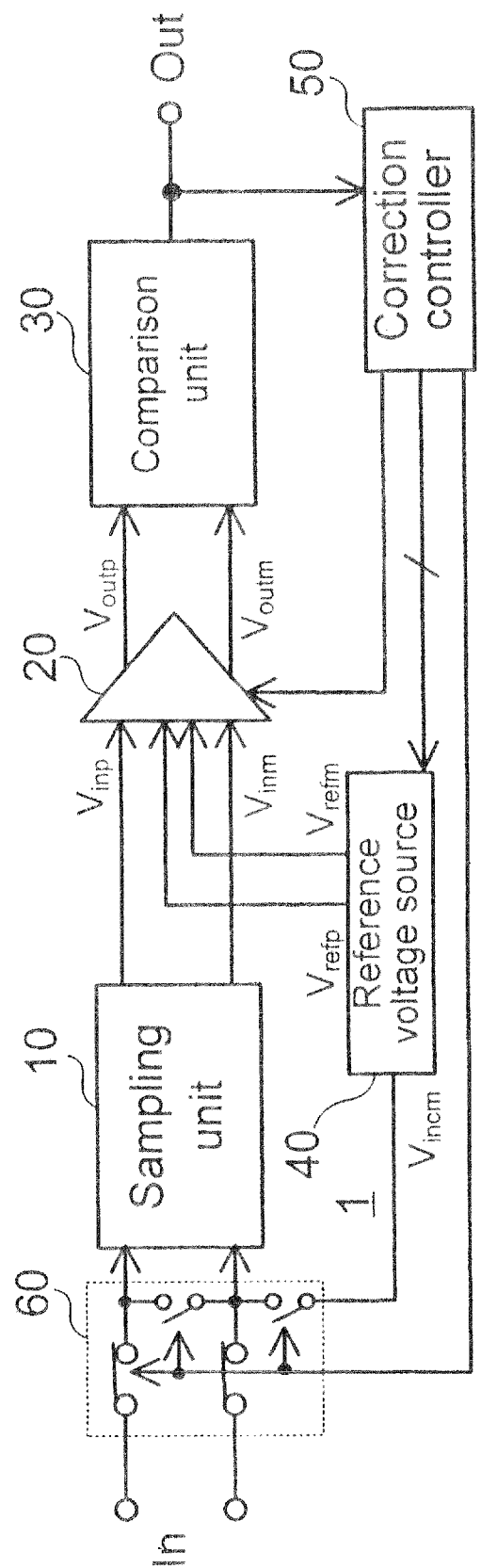
FIG. 1 is a block diagram showing a configuration of an analog-to-digital (AD) converter of a first embodiment.
Figure 2:
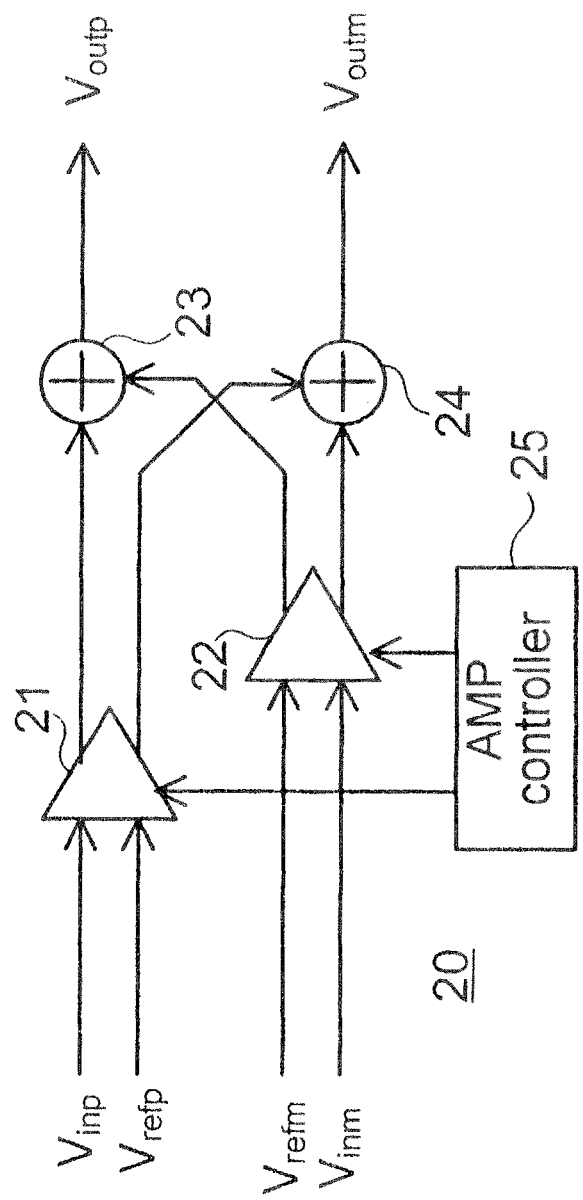
FIG. 2 is a block diagram showing an example of an amplifier in the AD converter of the first embodiment.

A configuration of an AD converter 1 of a first embodiment will be described with reference to FIGS. 1 to 3. As shown in FIG. 1, the AD converter 1 of this embodiment includes a sampling unit 10, a preamplifier 20, a comparison unit 30, and a reference voltage source 40. In the AD converter 1 of this embodiment, the preamplifier 20 amplifies a difference between a differential output signal of the sampling unit 10 and a reference voltage (common mode voltage) of the reference voltage source 40, and the comparison unit 30 converts an amplified output (differential signal) of the preamplifier 20 into a digital value.

The sampling unit 10 samples input signals at predetermined time intervals and then outputs sampled signals. In the example shown in FIG. 1, the sampling unit 10 samples differential input signals and outputs differential sampled signals.

The preamplifier 20 amplifies the sampled signals output by the sampling unit 10. In a specific example shown in FIG. 2, the preamplifier 20 includes differential amplifiers 21 and 22 and adders 23 and 24. The preamplifier 20 functions as a differential-difference amplifier that amplifies the input differential signals and outputs the signals as differential signals. The differential amplifier 21 differentially amplifies one output $V_{inp}$ (first sampled signal) of the sampling unit 10 and a reference voltage $V_{refp}$ (first reference signal). The differential amplifier 22 differentially amplifies a reference voltage $V_{refm}$ (second reference signal) and the other output $V_{inm}$ (second sampled signal) of the sampling unit 10. One of differential outputs of the differential amplifier 21 is input to the adder 23, and the other output is input to the adder 24. Further, one of differential outputs of the differential amplifier 22 is input to the adder 23, and the other output is input to the adder 24. Specifically, assuming that a gain of each of the differential amplifiers 21 and 22 is A, an output of the adder 23 is $V_{outp}$, and an output of the adder 24 is $V_{outm}$, a differential output $\Delta V_{out}$ of the preamplifier 20 is represented as shown in Expression 1 below.

$$\begin{aligned}\Delta V_{out} &= V_{outp} - V_{outm} \\ &= A\{(V_{inp} - V_{inm}) - (V_{refp} - V_{refm})\} \\ &= A(\Delta V_{in} - \Delta V_{ref})\end{aligned} \quad (1)$$

Thus, the preamplifier 20 amplifies a difference between a difference between the differential sampling outputs of the sampling unit 10 and a difference between the reference voltages of the reference voltage source 40. The preamplifier 20 further includes an amplifier controller (AMP controller) 25. The amplifier controller 25 has a function of deactivating one of the differential amplifiers 21 and 22.

The comparison unit 30 determines whether the output of the preamplifier 20, that is, $A(\Delta V_{in} - \Delta V_{ref})$ shown in Expression 1 is positive or negative and outputs a logical value of "1" or "0", for example. The reference voltage source 40 supplies the reference voltages $V_{refp}$ and $V_{refm}$ to the preamplifier 20. As shown in FIG. 1, the reference voltage source 40 of this embodiment is allowed to supply a correction voltage $V_{incm}$ to an input of the sampling unit 10 in addition to the reference voltages $V_{refp}$ and $V_{refm}$.

Figure 3:
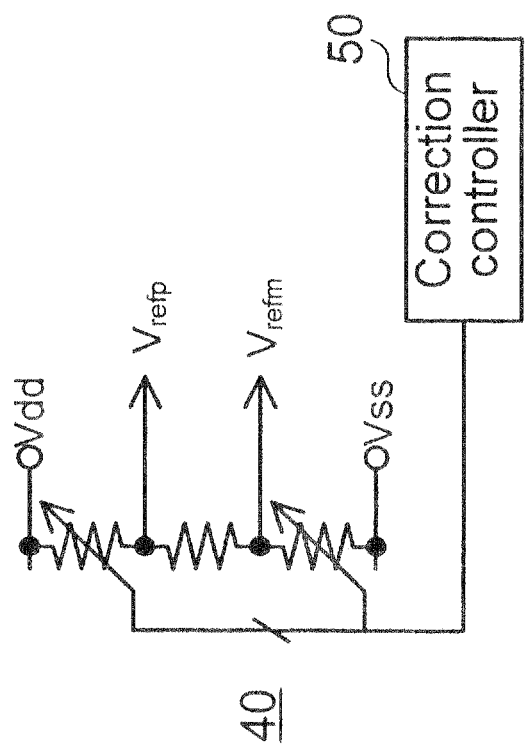
FIG. 3 is a diagram showing an example of a reference voltage source in the AD converter of the first embodiment.
Figure 4:
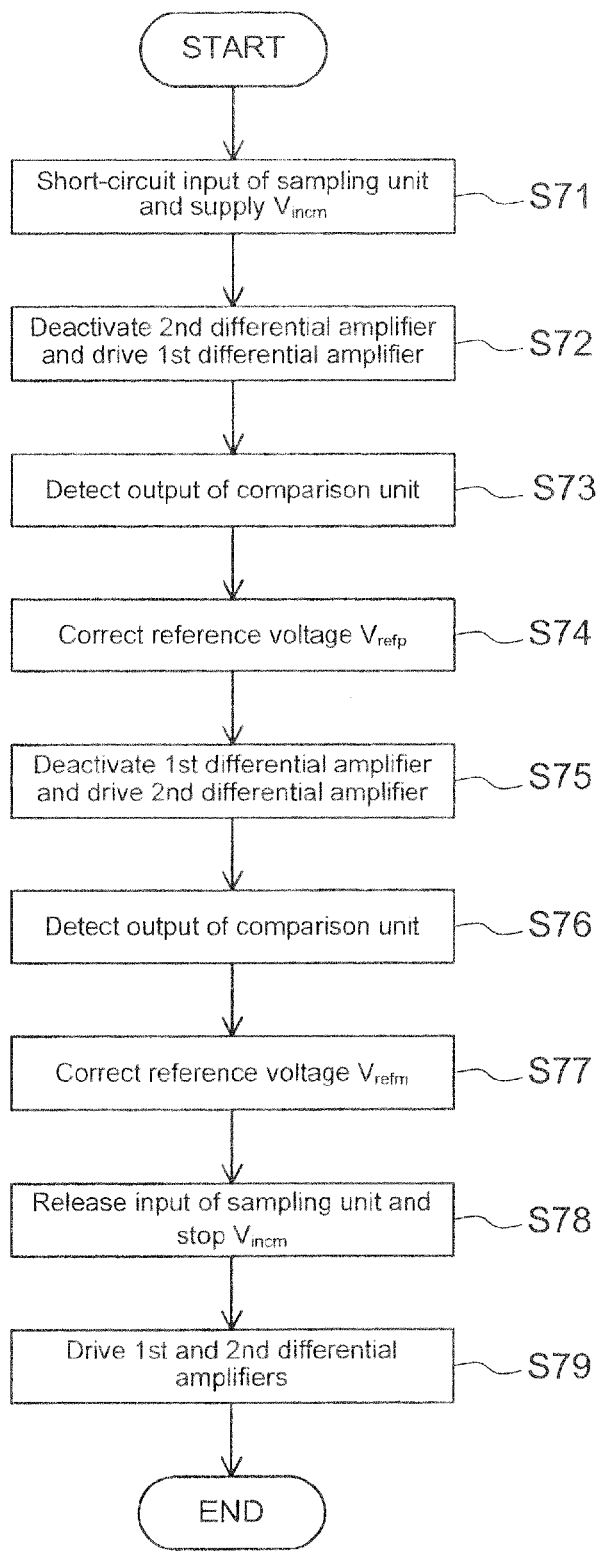
FIG. 4 is a flowchart showing an operation of the AD converter of the first embodiment.

The reference voltage source 40 has a configuration in which a resistor and two variable resistors are connected in series as shown in FIG. 3, for example. The two variable resistors are capable of changing a resistance value based on a control signal from a correction controller 50. Specifically, the reference voltage source 40 is capable of adjusting values of the two reference voltages $V_{refp}$ and $V_{refm}$ based on the control signal from the correction controller 50.

Generally, in a sampler of an AD converter, an output common-mode voltage of the sampler varies due to charge injection. Although the output common-mode voltage of the sampler has to equal a common mode voltage of a reference voltage intrinsically, the output common-mode voltage of the sampler is offset from the common mode voltage of the reference voltage due to the charge injection in the sampler. In this regard, the AD converter of this embodiment is configured to perform a correction operation of causing an output common-mode voltage of the sampling unit 10 to equal a common mode voltage of the reference voltage of the reference voltage source 40.

Specifically, the AD converter 1 of this embodiment includes the correction controller 50 and an input switching unit 60. The correction controller 50 achieves the control of the reference voltages $V_{refp}$ and $V_{refm}$ of the reference voltage source 40, the control of the differential amplifiers 21 and 22 of the preamplifier 20, and the control of the input switching unit 60, based on an output logical value of the comparison unit 30. The control of the reference voltages $V_{refp}$ and $V_{refm}$ of the reference voltage source 40 refers to the control of adjusting the reference voltage (common mode voltage) of the reference voltage source 40 so as to invert the output logical value of the comparison unit 30. The control of the differential amplifiers 21 and 22 of the preamplifier 20 refers to the control of deactivating or driving the differential amplifiers 21 and 22 that forms the preamplifier 20, during the correction operation of the AD converter 1 of this embodiment. The control of the input switching unit 60 refers to the control of switching the input of the sampling unit 10 during the correction operation of the AD converter 1 of this embodiment. The correction controller 50 is achieved using, for example, an up/down counter or using a correction unit used in a DC (direct current) offset canceller.

The input switching unit 60 includes a switching circuit that switches the input of the sampling unit 10 between an external input In and the correction voltage $V_{incm}$ of the reference voltage source 40 under the control of the correction controller 50. In the normal operation, the input switching unit 60 connects the input In and the input of the sampling unit 10 to each other and releases an input terminal of the sampling unit 10 from a short-circuit status. In the correction operation, the input switching unit 60 disconnects the input In and the input of the sampling unit 10 from each other, short-circuits the input of the sampling unit 10, and connects the output of the correction voltage $V_{incm}$ from the reference voltage source 40 and the input of the sampling unit 10 to each other. Specifically, in the correction operation, a common mode voltage (correction voltage $V_{incm}$) is supplied to the input of the sampling unit 10.

Operation of First Embodiment

Figure 5A:
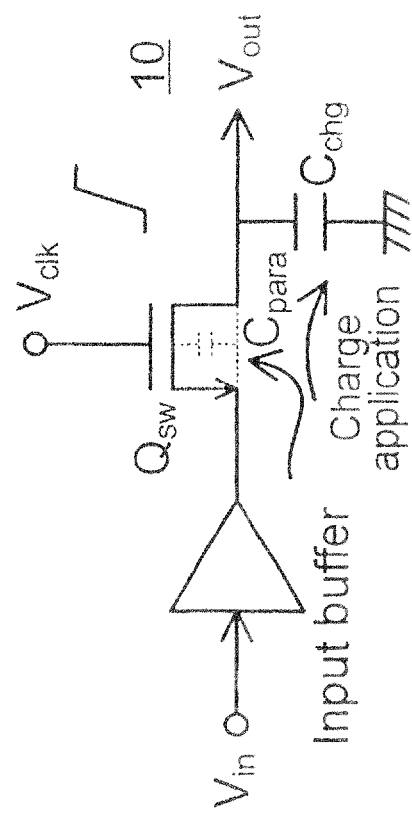
FIG. 5A is a diagram showing a state of charge injection due to a parasitic capacitance.
Figure 5B:
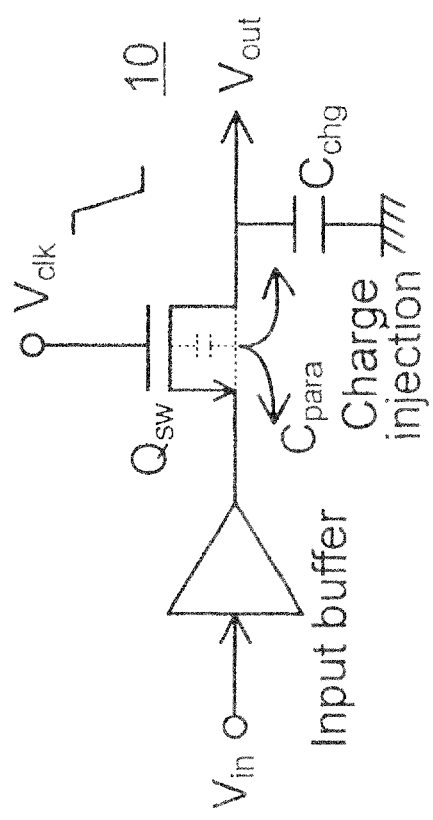
FIG. 5B is a diagram showing a state of charge injection due to a parasitic capacitance.

As shown in FIGS. 5A and 5B, the sampling unit 10 includes a switching device $Q_{SW}$ for sampling and a capacitor $C_{chg}$ for charging. When the switching device $Q_{SW}$ is turned on based on a clock signal $V_{clk}$ (FIG. 5A), the capacitor $C_{chg}$ is charged with an input signal $V_{in}$ amplified by an input buffer. At this time, charges are applied to not only the capacitor $C_{chg}$ but also a parasitic capacitance $C_{para}$ of the switching device $Q_{SW}$.

Subsequently, when the switching device $Q_{SW}$ is turned off based on the clock signal $V_{clk}$ (FIG. 5B), the charges accumulated in the parasitic capacitance $C_{para}$ also appear in the output $V_{out}$, in addition to the charges accumulated in the capacitor $C_{chg}$. As a result, the original input signal $V_{in}$ is inflated, which affects a determination in the comparison unit at a subsequent stage. The AD converter 1 of this embodiment reduces such an influence by adjusting a level of the common mode voltage or the reference voltage that is input to the preamplifier provided at the subsequent stage of the sampling unit 10.

Hereinafter, an operation of the AD converter 1 of the first embodiment will be described in detail with reference to FIGS. 1 to 6B.

Prior to the correction, the correction controller 50 controls a switch group that forms the input switching unit 60 to separate the input of the sampling unit 10 from the input In and to short-circuit a differential input terminal of the sampling unit 10. Additionally, the correction controller 50 connects the input of the sampling unit 10 and the output of the correction voltage $V_{incm}$ of the reference voltage source 40 to each other. As a result, the correction voltage $V_{incm}$ generated by the reference voltage source 40 is supplied to two input terminals of the sampling unit 10 (Step 71 of FIG. 4; hereinafter, abbreviated as "S71"). With this operation, the sampling unit 10 enters a no-input signal state.

Subsequently, the correction controller 50 deactivates the differential amplifier 22 (second differential amplifier), which is one of the two differential amplifiers of the preamplifier 20, via the amplifier controller 25, with the other differential amplifier 21 (first differential amplifier) being driven (S72). As a result, the differential amplifier 21 differentially amplifies a voltage $V_{inp}$ output from one differential output terminal of the sampling unit 10 and one reference voltage $V_{refp}$ of the reference voltage source 40. The differential outputs of the differential amplifier 21 are input to the adders 23 and 24. Since the differential amplifier 22 does not operate at this time, a voltage $V_{inm}$ output from the other differential output terminal of the sampling unit 10 and the other reference voltage $V_{refm}$ of the reference voltage source 40 are not output from the differential amplifier 22. In other words, the preamplifier 20 outputs the voltage $V_{inp}$ and the reference voltage $V_{refp}$ that are amplified by the differential amplifier 21.

The comparison unit 30 compares the outputs of the preamplifier 20 and determines whether the outputs are positive or negative (S73). Here, if the correction voltage $V_{incm}$ input to the sampling unit 10 is caused to equal the reference voltage $V_{refp}$ of the reference voltage source 40 in advance, the output of the comparison unit 30 indicates voltage variations due to the charge injection of the sampling unit 10.

The correction controller 50 adjusts the reference voltage $V_{refp}$ of the reference voltage source 40 so as to invert the output logical value of the comparison unit 30 (S74). Specifically, the correction controller 50 adjusts the reference voltage $V_{refp}$ so as to equal the voltage $V_{inp}$ and the reference voltage $V_{refp}$. The correction controller 50 holds a value of the adjusted reference voltage $V_{refp}$ as a corrected value.

Subsequently, the correction controller 50 deactivates the differential amplifier 21 (first differential amplifier), which is one of the two differential amplifiers of the preamplifier 20, via the amplifier controller 25, and drives the other differential amplifier 22 (second differential amplifier) (S75). As a result, the differential amplifier 22 differentially amplifies the voltage $V_{inm}$ output from the other differential output terminal of the sampling unit 10 and the other reference voltage $V_{refm}$ of the reference voltage source 40. The differential outputs of the differential amplifier 22 are input to the adders 23 and 24. Since the differential amplifier 21 does not operate at this time, the voltage $V_{inp}$ output from the one differential output terminal of the sampling unit 10 and the one reference voltage $V_{refp}$ of the reference voltage source 40 are not output from the differential amplifier 21. In other words, the preamplifier 20 outputs the voltage $V_{inm}$ and the reference voltage $V_{refm}$ that are amplified by the differential amplifier 22.

The comparison unit 30 compares the outputs of the preamplifier 20 and determines whether the outputs are positive or negative (S76). Here, if the correction voltage $V_{incm}$ input to the sampling unit 10 is caused to equal the reference voltage $V_{refm}$ of the reference voltage source 40 in advance, the output of the comparison unit 30 indicates voltage variations due to the charge injection of the sampling unit 10.

The correction controller 50 adjusts the reference voltage $V_{refm}$ of the reference voltage source 40 so as to invert the output logical value of the comparison unit 30 (S77). Specifically, the correction controller 50 adjusts the reference voltage $V_{refm}$ so as to equal the voltage $V_{inm}$ and the reference voltage $V_{refm}$. The correction controller 50 holds a value of the adjusted reference voltage $V_{refm}$ as a corrected value.

Subsequently, the correction controller 50 controls the switch group of the input switching unit 60 to disconnect the input of the sampling unit 10 from the output of the correction voltage $V_{incm}$ of the reference voltage source 40. In addition, the correction controller 50 releases a short circuit of the differential input terminal of the sampling unit 10 and connects the input of the sampling unit 10 to the input In (S78).

Then, the correction controller 50 sets each of the reference voltage $V_{refp}$ and the reference voltage $V_{refm}$ of the reference voltage source 40 to the held corrected value and drives the differential amplifiers 21 and 22 through the amplifier controller 25 (S79).

As described above, since the AD converter of this embodiment is configured such that the two differential amplifiers provided in the preamplifier are each capable of being deactivated, level variations due to the charge injection are detected in the comparison unit when no signals are set to be input to the sampling unit 10. In other words, level variations due to the charge injection are corrected without adding a special circuit to the sampling unit or the comparison unit.

It should be noted that the correction operation is performed on each of the two reference voltages $V_{refp}$ and $V_{refm}$ in this embodiment, but the correction operation is not limited thereto. If the parasitic capacitances of the switching devices at the differential input terminals of the sampling unit 10 are substantially equal to each other, one of the reference voltages may be corrected and then the other reference voltage may be set to the corrected value of the one reference voltage. Specifically, the AD converter 1 of this embodiment may be configured such that Steps 75 to 77 are omitted from Steps 72 to 77 of FIG. 4 and the reference voltage $V_{refm}$ is set to the corrected reference voltage $V_{refp}$.

(Meaning of Deactivating One of Differential Amplifiers of Preamplifier)

Figure 6A:
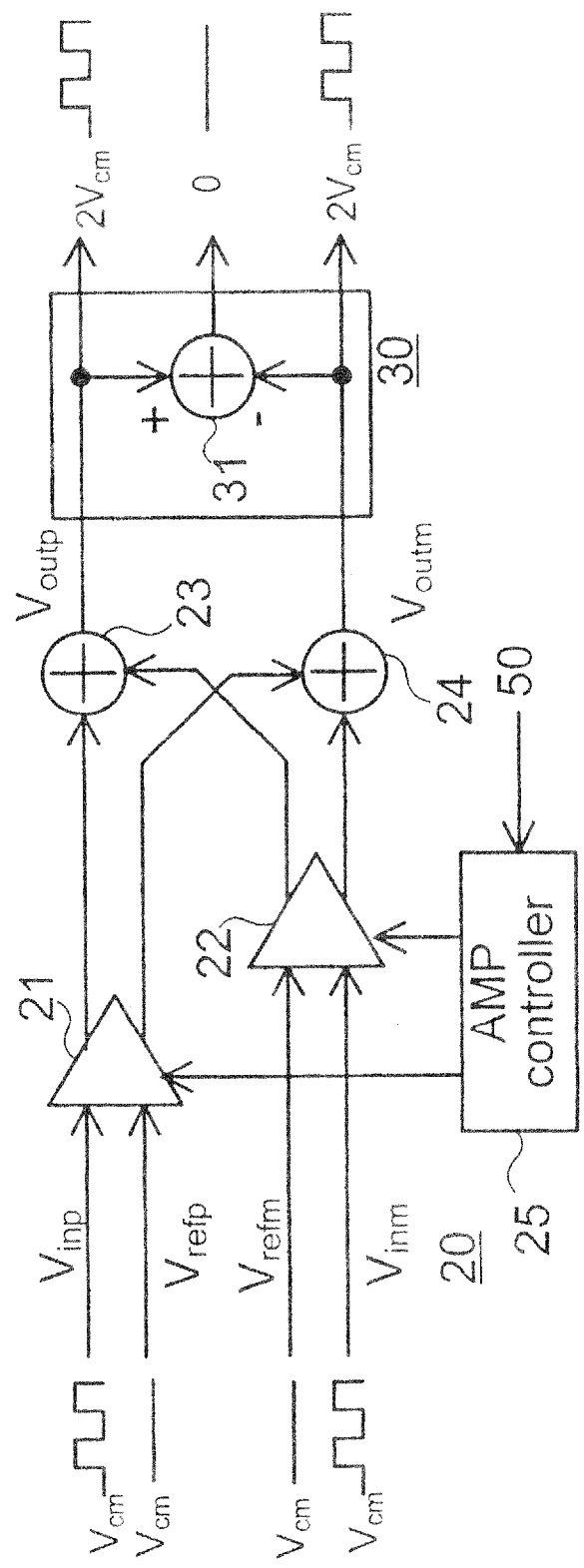
FIG. 6A is a diagram showing a normal operation of a preamplifier in the AD converter of the first embodiment.

The meaning of deactivating one of the differential amplifiers of the preamplifier will be described with reference to FIGS. 6A and 6B. The switching devices for sampling of the sampling unit 10 are each connected to paired differential signal lines, and parasitic capacitances of the respective switching devices are substantially equal to each other. In other words, the degrees of charge injection generated at the paired switches of the sampling unit 10 are substantially equal to each other. Therefore, as shown in FIG. 6A, when the preamplifier 20 is normally operated, an adder 31 (subtractor) provided in the comparison unit 30 cancels voltage variations caused by the charge injection and does not detect the voltage variations (see Expression 1).

Figure 6B:
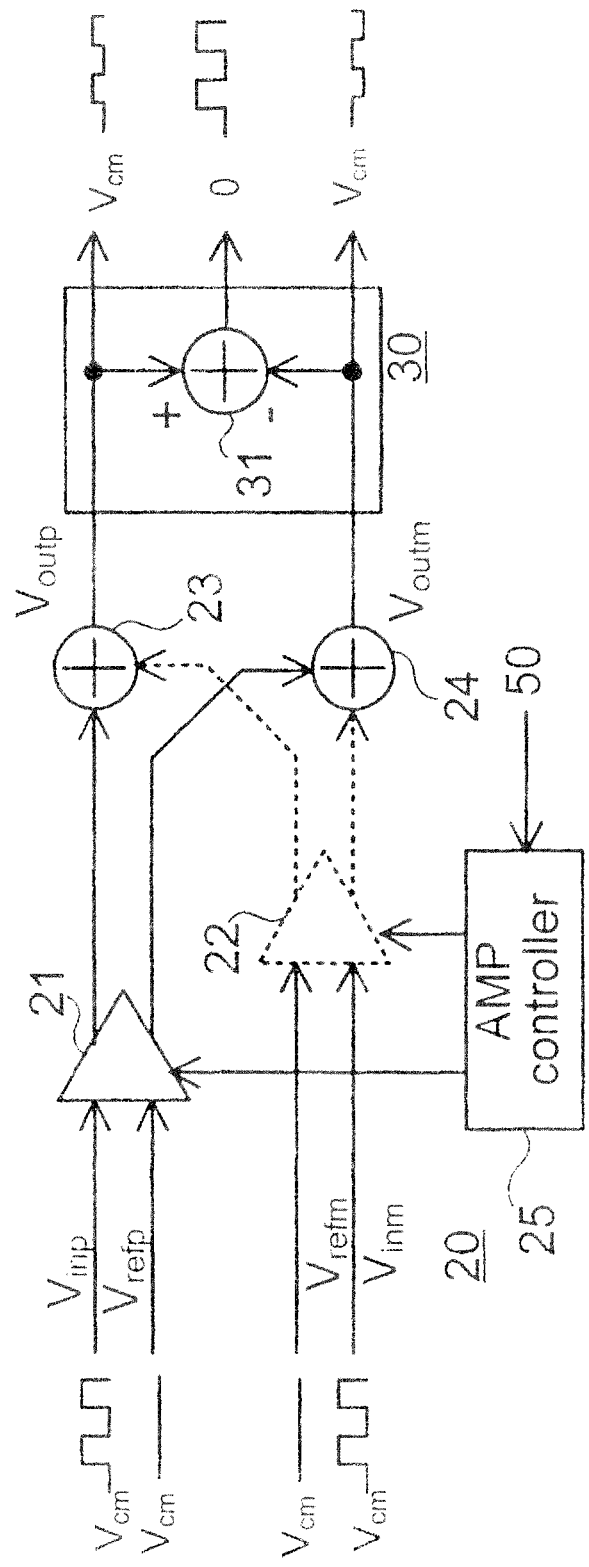
FIG. 6B is a diagram showing a correction operation of the preamplifier in the AD converter of the first embodiment.

Thus, the differential amplifier 22 (or differential amplifier 21) is deactivated as shown in FIG. 6B. With this operation and configuration, the output of the preamplifier 20 is set to be the input voltage $V_{inp}$ (or $V_{inm}$) that has varied due to the charge injection and the reference voltage $V_{refp}$ (or $V_{refm}$) that has not been influenced by the charge injection. In other words, the voltage variations due to the charge injection are allowed to be detected in the comparison unit as the subsequent stage (Expression 2).

$$\Delta V_{out} = V_{outp} - V_{outm} \quad (2)$$
$$= A\{(V_{inp} - V_{inm}) - (V_{refp} - V_{refm})\}$$
$$= A\{(V_{inp} - 0) - (V_{refp} - 0)\}$$
$$= A(V_{inp} - V_{refp})$$

At the time when no analog signals are input, the output common-mode voltage of the sampling unit 10 is input to the voltage $V_{inp}$ of the preamplifier 20. On the other hand, the common mode voltage from the reference voltage source 40 is input to the reference voltage $V_{refp}$. Ideally, the output common-mode voltage of the sampling unit 10 and the common mode voltage of the reference voltage are equal to each other ($V_{inp}=V_{refp}$), and therefore the output $\Delta V_{out}$ of the preamplifier is zero. Actually, however, due to the charge injection in the sampling unit 10, the preamplifier 20 amplifies the amount of variations in common mode voltage of the output of the sampling unit 10. Thus, the amount of variations in common mode voltage due to the charge injection in the sampling unit 10 is detected in the comparison unit 30.

Since the AD converter 1 of this embodiment is configured to be capable of individually deactivating the differential amplifiers provided in the preamplifier 20, the voltage variations due to the charge injection are detected and corrected without modifying the sampling unit 10 and the comparison unit 30.

(Specific Example of Preamplifier)

A specific example of the preamplifier 20 of this embodiment will be described with reference to FIG. 7. A preamplifier shown in FIG. 7 includes metal-oxide-semiconductor field-effect transistors (MOSFETs) $Q_{p1}$ and $Q_{p2}$ whose sources are connected to each other and a MOSFET $Q_{p3}$ whose source is grounded and whose drain is connected to the sources of the MOSFETs $Q_{p1}$ and $Q_{p2}$. A drain of the MOSFET $Q_{p1}$ is connected to an output $V_{outp}$ and to a power source Vdd via a resistor. On the other hand, a drain of the MOSFET $Q_{p2}$ is connected to an output $V_{outm}$ and to the power source Vdd via a resistor. Gates of the MOSFETs $Q_{p1}$ and $Q_{p2}$ are connected to an input voltage $V_{inp}$ and a reference voltage $V_{refp}$, respectively.

Figure 7:
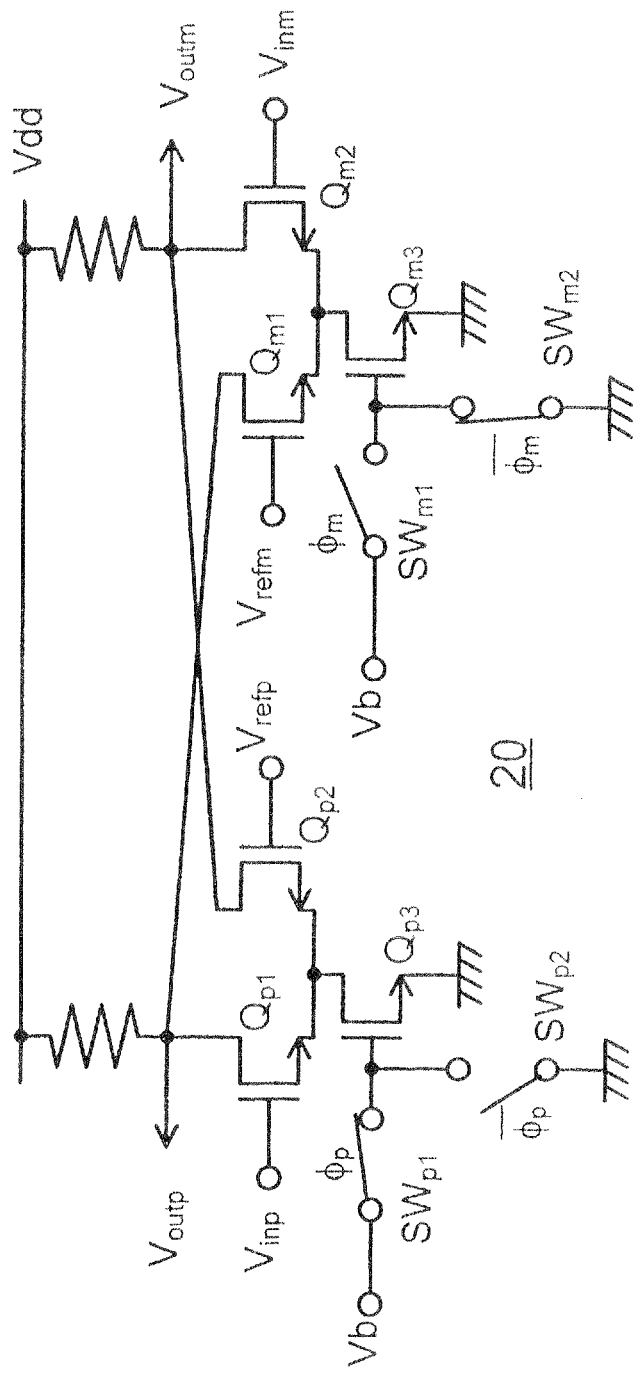
FIG. 7 is a diagram showing an example of the preamplifier in the AD converter of the first embodiment.

In addition, the preamplifier shown in FIG. 7 includes MOSFETs $Q_{m1}$ and $Q_{m2}$ whose sources are connected to each other and a MOSFET $Q_{m3}$ whose source is grounded and whose drain is connected to the sources of the MOSFETs $Q_{m1}$ and $Q_{m2}$. A drain of the MOSFET $Q_{m1}$ is connected to the output $V_{outp}$ and to the power source Vdd via the resistor. On the other hand, a drain of the MOSFET $Q_{m2}$ is connected to the output $V_{outm}$ and to the power source Vdd via the resistor. Gates of the MOSFETs $Q_{m1}$ and $Q_{m2}$ are connected to a reference voltage $V_{refm}$ and an input voltage $V_{inm}$, respectively.

The gates of the MOSFET $Q_{p3}$ and $Q_{m3}$ are connected with switches $SW_{p1}$, $SW_{m1}$, $SW_{p2}$ and $SW_{m2}$. The switches $SW_{p1}$ and $SW_{m1}$ are configured to connect one of the gates of the MOSFET $Q_{p3}$ and $Q_{m3}$ to the bias power source Vb. The switches $SW_{p2}$ and $SW_{m2}$ are configured to connect one of the gates of the MOSFET $Q_{p3}$ and $Q_{m3}$ to the ground.

In the preamplifier shown in FIG. 7, the control of the switches $SW_{p1}$, $SW_{m1}$, $SW_{p2}$, and $SW_{m2}$ allows operations of the MOSFETs $Q_{p1}$, $Q_{p2}$, and $Q_{p3}$ or operations of the MOSFETs $Q_{m1}$, $Q_{m2}$, and $Q_{m3}$ to be stopped.

Second Embodiment

Figure 8:
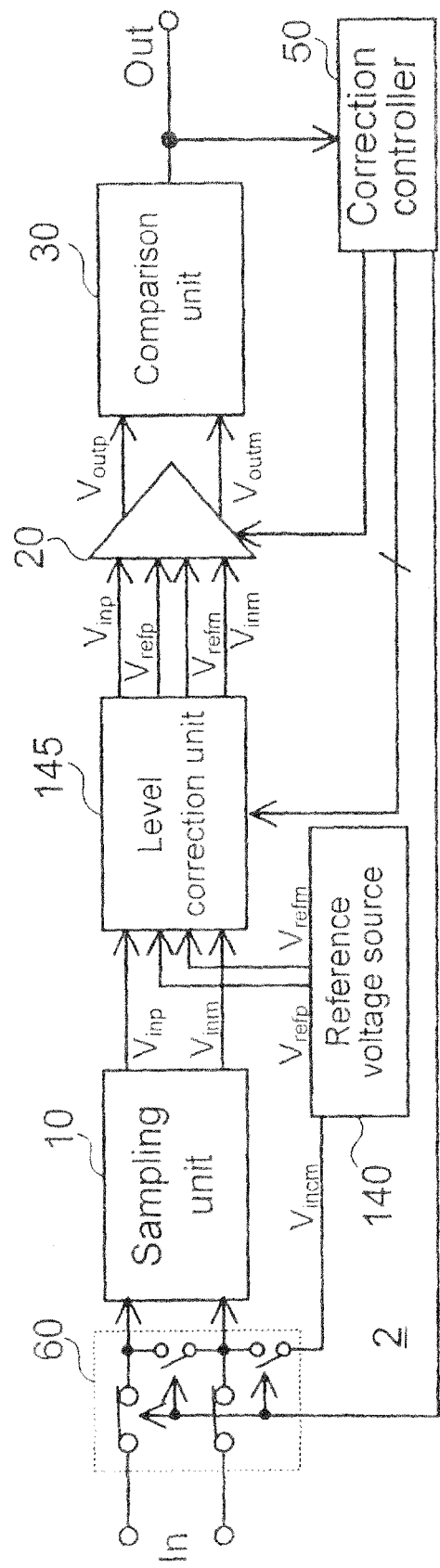
FIG. 8 is a block diagram showing a configuration of an AD converter of a second embodiment.
Figure 9:
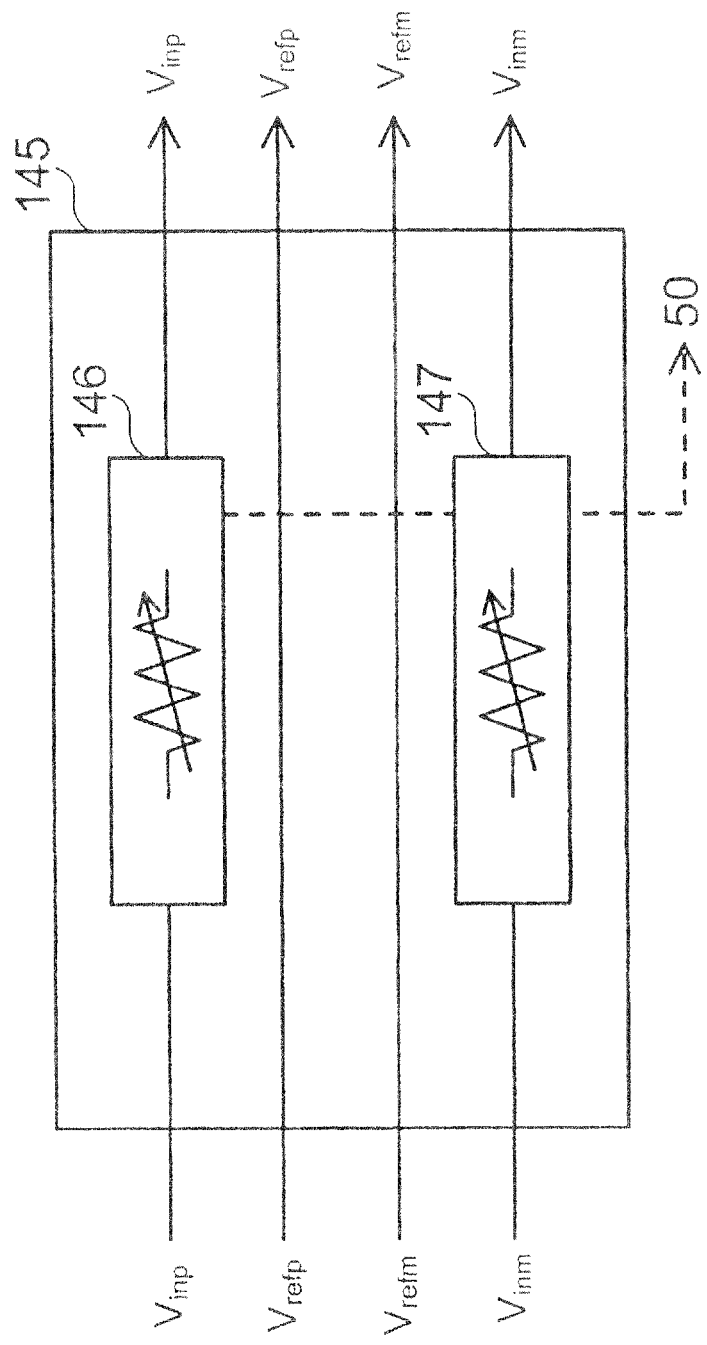
FIG. 9 is a diagram showing an example of a level correction unit in the AD converter of the second embodiment.

Next, an AD converter of a second embodiment will be described with reference to FIGS. 8 and 9. An AD converter 2 of this embodiment is configured such that two reference voltages $V_{refp}$ and $V_{refm}$ generated by the reference voltage source in the AD converter of the first embodiment shown in FIG. 1 are fixed, while a level correction unit that adjusts a voltage level of an output common-mode voltage of a sampling unit 10 or reference voltages $V_{refp}$ and $V_{refm}$ is provided between the sampling unit 10 and a preamplifier 20. In the following description, configurations common to those of the AD converter shown in FIGS. 1 to 3 are denoted by the common reference symbols, and overlapping descriptions thereof will be omitted.

A reference voltage source 140 supplies the reference voltages $V_{refp}$ and $V_{refm}$ to the preamplifier 20. It should be noted that values of the reference voltages $V_{refp}$ and $V_{refm}$ are fixed values, which are set in advance. As shown in FIG. 8, the reference voltage source 140 of this embodiment is allowed to supply a correction voltage $V_{incm}$ to the input of the sampling unit 10, in addition to the reference voltages $V_{refp}$ and $V_{refm}$.

A level correction unit 145 corrects, based on a control signal from a correction controller 50, any one of an output common-mode voltage of the sampling unit 10 and an output common-mode voltage of the reference voltage source 140 such that those voltages are equal to each other. The level correction unit 145 includes level shifters that control a voltage level. The level shifters are provided on signal lines of at least one of differential outputs $V_{inp}$ and $V_{inm}$ of the sampling unit 10 and the reference voltages $V_{refp}$ and $V_{refm}$ of the reference voltage source 140. In the example shown in FIG. 9, level shifters 146 and 147 are provided on the lines of the differential outputs $V_{inp}$ and $V_{inm}$ of the sampling unit 10. The level shifters 146 and 147 are capable of adjusting the voltage levels based on respective control signals from the correction controller 50.

The correction controller 50 of this embodiment adjusts the voltage levels of the level shifters 146 and 147 of the level correction unit 145, instead of adjusting the reference voltages $V_{refp}$ and $V_{refm}$ of the reference voltage source 40 in the first embodiment. Thus, as in the first embodiment, the voltage variations due to the charge injection are detected and corrected without modifying the sampling unit 10 and the comparison unit 30. Further, since it is not necessary to adjust the values of the reference voltages of the reference voltage source 140, the accuracy of the reference voltages is enhanced and the comparison accuracy of the comparison unit is enhanced.

Third Embodiment

Next, an AD converter of a third embodiment will be described with reference to FIG. 10. An AD converter 3 of this embodiment includes an input buffer 270 (a buffer amplifier) capable of controlling a gain, the input buffer 270 being provided between an input switching unit 60 and a sampling unit 10, instead of the level correction unit 145 in the AD converter of the second embodiment shown in FIG. 8. In the following description, configurations common to those of the AD converters shown in FIGS. 1 to 3, 8, and 9 are denoted by the common reference symbols, and overlapping descriptions thereof will be omitted.

Figure 10:
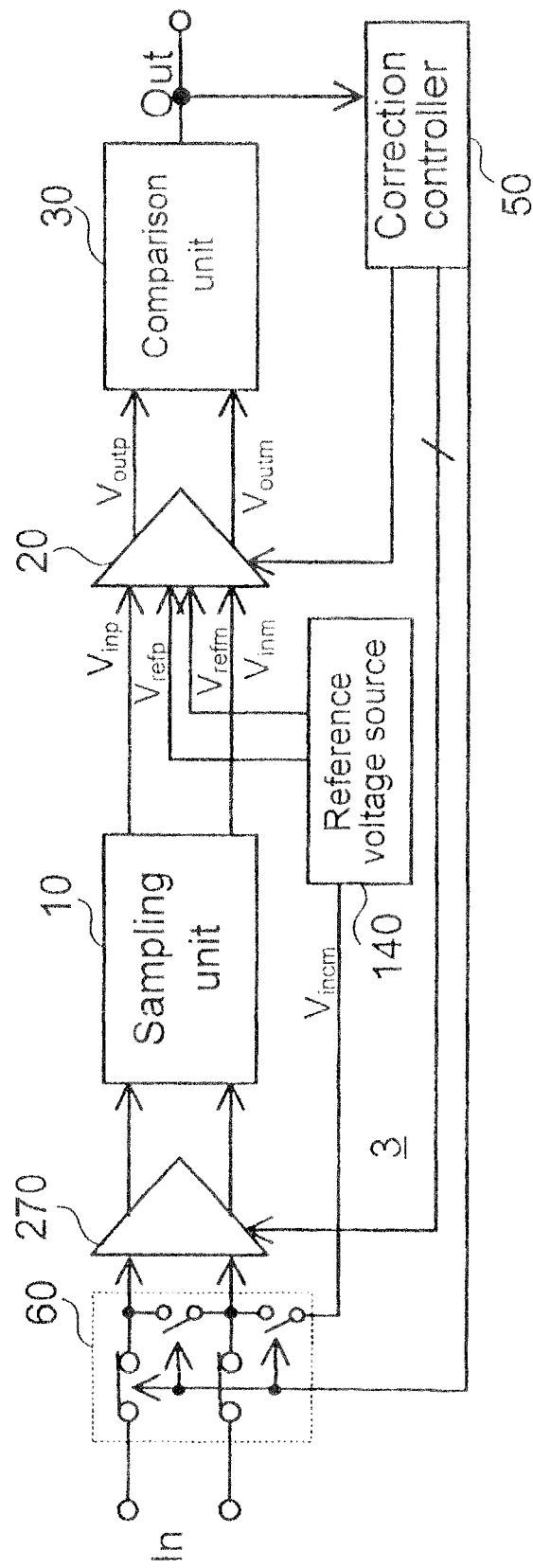
FIG. 10 is a block diagram showing a configuration of an AD converter of a third embodiment.

As shown in FIG. 10, the AD converter 3 of this embodiment includes the input buffer 270. The input buffer 270 controls, based on a control signal from a correction controller 50, an input common-mode voltage of the sampling unit 10 such that an output common-mode voltage of the sampling unit 10 and an output common-mode voltage of a reference voltage source 140 are equal to each other. Specifically, the input buffer 270 reduces the level of a differential input signal that is input to the sampling unit 10, by a voltage level corresponding to the charge injection in the sampling unit 10.

The correction controller 50 of this embodiment adjusts a common-mode voltage level of a differential input that is input to the sampling unit 10, instead of adjusting the voltage levels of the level shifters of the level correction unit 145 in the second embodiment. Thus, as in the first and second embodiments, the voltage variations due to the charge injection are detected and corrected without modifying the sampling unit 10 and a comparison unit 30. Further, since it is not necessary to adjust the values of the reference voltages of the reference voltage source 140, the accuracy of the reference voltages is enhanced and the comparison accuracy of the comparison unit is enhanced.

Fourth Embodiment

Next, an AD converter of a fourth embodiment will be described with reference to FIG. 11. An AD converter 4 of this embodiment is obtained by adding a DC offset canceller to the AD converter of the first embodiment shown in FIG. 1. In the following description, configurations common to those of the AD converter 1 shown in FIGS. 1 to 3 are denoted by the common reference symbols, and overlapping descriptions thereof will be omitted.

Figure 11:
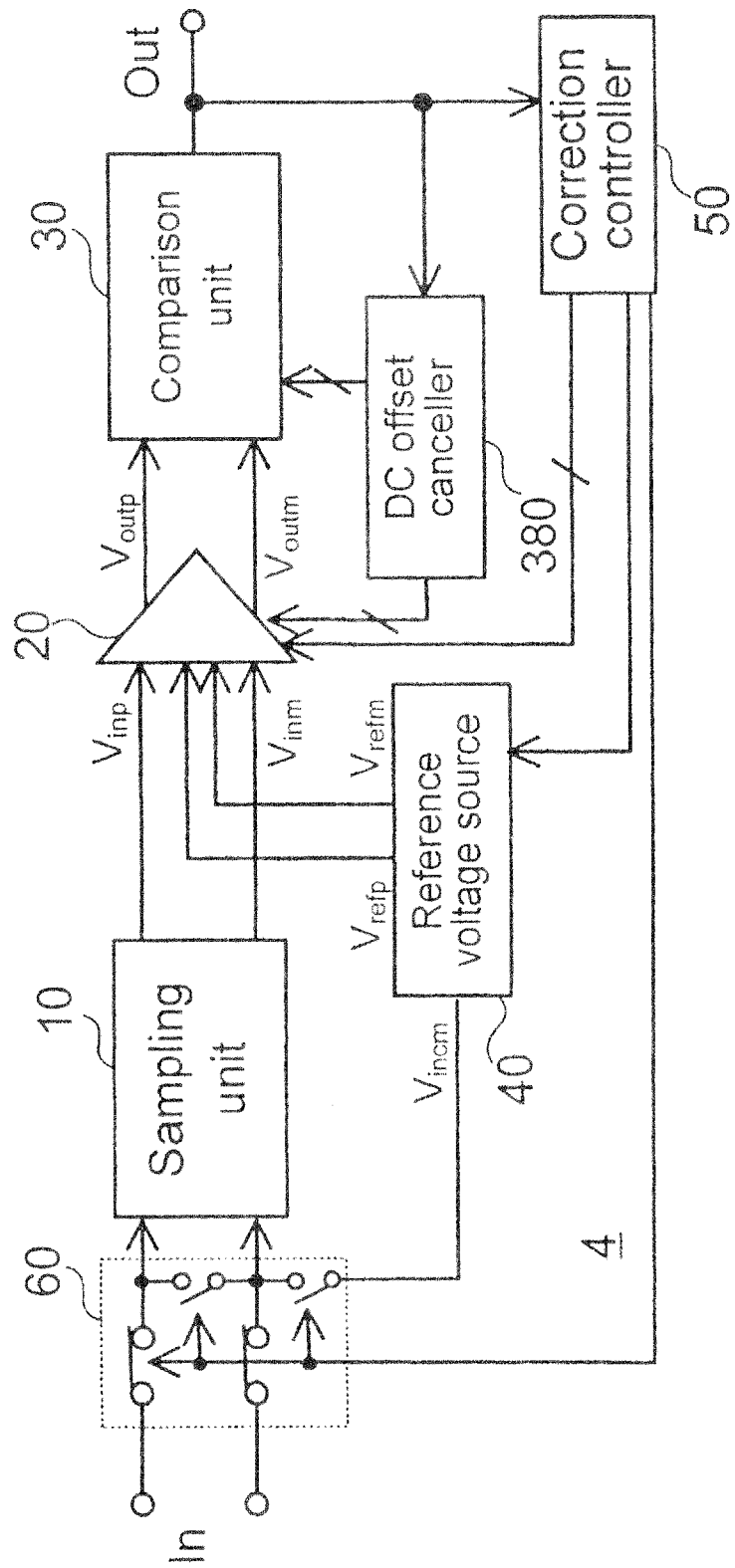
FIG. 11 is a block diagram showing a configuration of an AD converter of a fourth embodiment.

As shown in FIG. 11, the AD converter 4 of this embodiment includes a DC offset canceller 380. The DC offset canceller 380 suppresses a DC offset in a preamplifier 20 and a comparison unit 30 based on the output of the comparison unit 30. In the correction of a common-mode voltage level, which is performed while differential amplifiers 21 and 22 that form the preamplifier 20 are deactivated, the correction accuracy is degraded when the DC offset exists in the preamplifier 20 or the comparison unit 30. For that reason, the DC offset is suppressed by the DC offset canceller 380 and thereafter the common-mode voltage level is corrected using the preamplifier 20, with the result that a highly accurate correction of common-mode voltage variations is achieved. Specifically, prior to Step 71 shown in FIG. 4, the DC offset canceller 380 executes DC offset correction.

It should be noted that in this embodiment, the DC offset canceller 380 is added to the AD converter 1 of the first embodiment, but the embodiment is not limited thereto. Also when the DC offset canceller is added to the AD converter 2 of the second embodiment shown in FIG. 8 or to the AD converter 3 of the third embodiment shown in FIG. 10, the same effect is produced.

Fifth Embodiment

Next, an AD converter of a fifth embodiment will be described with reference to FIG. 12. An AD converter 5 of this embodiment is a parallel AD converter configured by using the AD converter of the first embodiment shown in FIG. 1. In the following description, configurations common to those of the AD converter 1 shown in FIGS. 1 to 3 are denoted by the common reference symbols, and overlapping descriptions thereof will be omitted.

Figure 12:
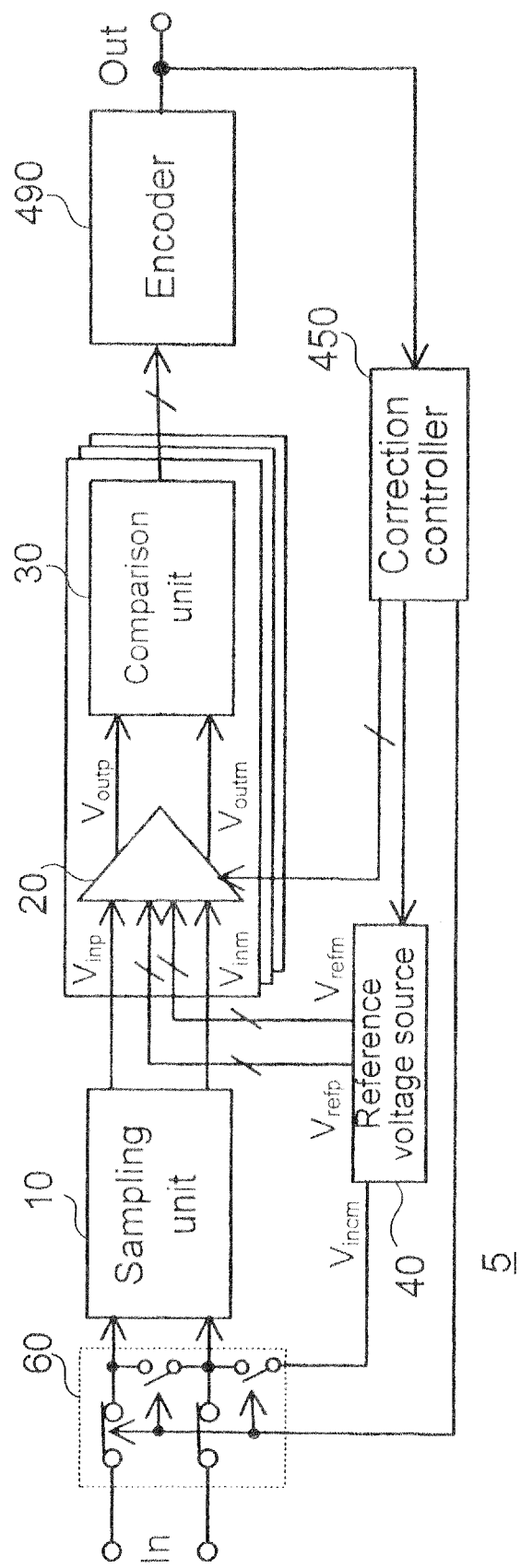
FIG. 12 is a block diagram showing a configuration of an AD converter of a fifth embodiment.

As shown in FIG. 12, the AD converter 5 of this embodiment includes a plurality of units, each of which is constituted of a preamplifier 20 and a comparison unit 30. The AD converter 5 includes an encoder 490 and a correction controller 450. The encoder 490 encodes a logical value output of each of the comparison units 30. The correction controller 450 performs the control of reference voltages $V_{refp}$ and $V_{refm}$ of a reference voltage source 40, the control of differential amplifiers 21 and 22 of each of the preamplifiers 20, and the control of an input switching unit 60, based on the output of the encoder 490.

In the AD converter of this embodiment, the amount of variations in common mode voltage is obtained as digital information. Thus, the amount of variations in common mode voltage is detected and corrected at high speed, as compared to the AD converter of the first embodiment. It should be noted that the AD converter of the first embodiment is used in this embodiment, but the embodiment is not limited thereto. Also when the AD converter of the fifth embodiment is configured by using the AD converter 2 of the second embodiment shown in FIG. 8, the AD converter 3 of the third embodiment shown in FIG. 10, and the AD converter 4 of the fourth embodiment shown in FIG. 11, the same effect is produced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An analog-to-digital converter, comprising:
   a sampling unit configured to sample differential input signal to output a differential sampled signal, the differential sampled signal having a first sampled signal and a second sampled signal;
   a reference signal generator configured to generate a first reference signal and a second reference signal;
   a preamplifier configured to amplify the differential sampled signal to output a differential amplification signal having a first amplified output and a second amplified output,
   the preamplifier having
      a first differential amplifier configured to amplify the first sampled signal by using the first reference signal, and
      a second differential amplifier configured to amplify the second sampled signal by using the second reference signal,
      the first amplified output being based on an output of the first differential amplifier and the second reference signal,
      the second amplified output being based on an output of the second differential amplifier and the first reference signal;
   a comparator configured to compare the first amplified output and the second amplified output with each other; and
   a correction controller configured to control operations of the first differential amplifier and the second differential amplifier based on a comparison result of the comparator, and control common-mode voltage levels of the first reference signal and the second reference signal or common-mode voltage levels of the first sampled signal and the second sampled signal in accordance with the operations of the first differential amplifier and the second differential amplifier.

2. The analog-to-digital converter according to claim 1, wherein the correction controller controls the common-mode voltage level of one of the first reference signal and the first sampled signal so as to substantially conform the common mode voltage level of the first reference signal to the common mode voltage level of the first sampled signal with no input to the sampling unit, when controlling the first differential amplifier to operate and controlling the second differential amplifier to be deactivated.

3. The analog-to-digital converter according to claim 1, further comprising:

a first adder configured to add the first sampled signal amplified by the first differential amplifier to the second reference signal amplified by the second differential amplifier to generate the first amplified output; and a second adder configured to add the second sampled signal amplified by the second differential amplifier to the first reference signal amplified by the first differential amplifier to generate the second amplified output.

4. The analog-to-digital converter according to claim 1, further comprising a direct current offset canceller configured to correct a direct current offset of at least one of the preamplifier and the comparator based on the comparison result of the comparison unit.

5. The analog-to-digital converter according to claim 1, wherein the reference signal generator is configured to control the common-mode voltage levels of the first reference signal and the second reference signal based on a control signal from the correction controller.

6. The analog-to-digital converter according to claim 1, further comprising a level correction unit configured to adjust the common-mode voltage levels of the first sampled signal and the second sampled signal based on a control signal from the correction controller.

7. The analog-to-digital converter according to claim 1, further comprising a buffer amplifier configured to control a common-mode voltage level of the differential input signal based on a control signal from the correction controller.

8. An analog-to-digital converter, comprising:
a sampling unit configured to sample differential input signals to output a differential sampled signal, the differential sampled signal having a first sampled signal and a second sampled signal;
a reference signal generator configured to generate a first reference signal and a second reference signal;
a plurality of preamplifiers each configured to amplify the differential sampled signal to output a differential amplification signal having a first amplified output and a second amplified output,
the preamplifiers each having
a first differential amplifier configured to amplify the first sampled signal by using the first reference signal, and
a second differential amplifier configured to amplify the second sampled signal by using the second reference signal,
the first amplified output being based on an output of the first differential amplifier and the second reference signal,
the second amplified output being based on an output of the second differential amplifier and the first reference signal;
a plurality of comparators each configured to compare the first amplified output and the second amplified output with each other;
an encoder configured to generate a binary code based on comparison results of the plurality of comparator; and
a correction controller configured to control operations of the first differential amplifier and the second differential amplifier based on the binary code generated by the encoder unit and control common-mode voltage levels of the first reference signal and the second reference signal or common-mode voltage levels of the first sampled signal and the second sampled signal in accordance with the operations of the first differential amplifier and the second differential amplifier.

* * * * *